April 26, 1966 J. L. WALSH 3,248,561

LOGIC CIRCUIT

Filed April 20, 1962

3 Sheets-Sheet 1

INVENTOR
JAMES L. WALSH

BY Joseph C. Redmond, Jr.

ATTORNEY

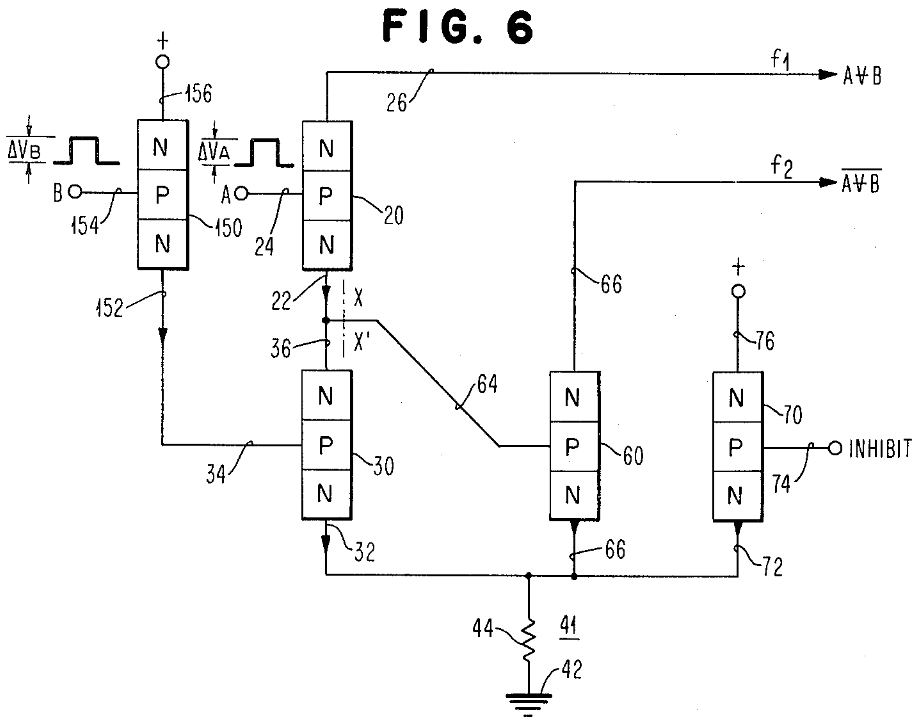
FIG. 6
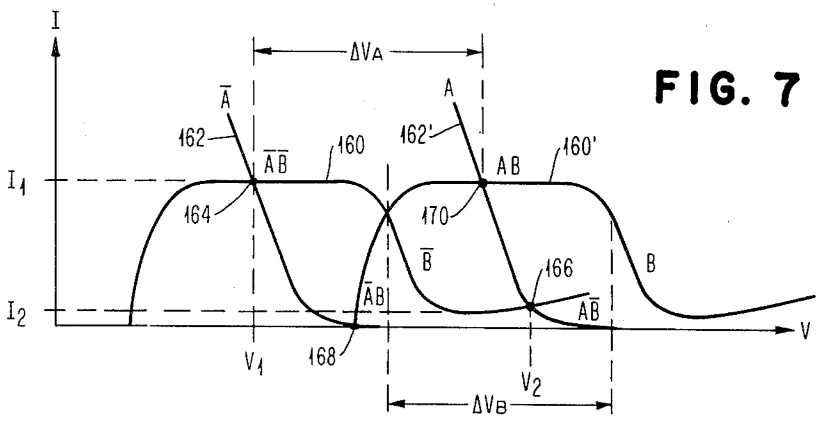
FIG. 7
FIG. 8A
| B \ A | 0 | 1 |
|---|---|---|
| 0 | 1 | 0 |
| 1 | 0 | 1 |
$f_1 = A∀B$
| B \ A | 0 | 1 |
|---|---|---|
| 0 | 0 | 1 |
| 1 | 1 | 0 |
$f_2 = \overline{A∀B}$
FIG. 8B United States Patent Office 3,248,561

Patented Apr. 26, 1966

3,248,561

LOGIC CIRCUIT

James L. Walsh, Hyde Park, N.Y., assignor to International Business Machines Corporation, New York, N.Y., a corporation of New York Filed Apr. 20, 1962, Ser. No. 189,163
10 Claims. (Cl. 307—88.5)

This invention relates to switching circuits and, more particularly, to switching circuits suitable for use in computers and like apparatus.

Switching circuits perform the logic of computers and like apparatus. The logic potential of the apparatus is related to the capabilities of the circuits employed therein. Likewise, the cost of the apparatus is related to the quantity of circuits necessary to perform the desired logic operations. It is incumbent the circuits employed have considerable logic potential with a minimum number of active elements, such as transistors. Such circuits should also provide adequate gain for signal transmission, operate without excess minority carrier storage problems and be relatively independent of signal tolerances. It is desirable, therefore, to provide switching circuits having these qualtities so that computers and like apparatus may be more useful and economically available to the business and scientific communities.

A general object of the invention is an improved switching circuit having considerable logic flexibility and a minimum number of active circuit elements.

Another object is a transistor switching circuit that provides high gain without the attendant problems of saturation.

Another object is a switching circuit that can provide in the same circuitry both AND-OR and inversion logic functions.

Another object is a switching circuit that provides an implication function.

Still another object is a switching circuit that provides the Exclusive-OR function.

These and other objects are accomplished in accordance with the present invention one illustrative embodiment of which comprises first and second transistor amplifiers of like conductivity connected in series aiding relation, i.e., the emitter of one amplifier being connected to the collector of the other amplifier. The remaining collector and emitter electrodes of the amplifiers are connected to a voltage supply and a current source, respectively. Normally, both amplifiers are conducting in a nonsaturated condition. A common point therebetween is connected as an input to a third transistor which performs an inverting function, the voltage level at the common point being sufficient normally to retain the third transistor nonconducting. Cooperating with the third transistor is a fourth transistor adapted to inhibit the flow of current in the third transistor. When an input signal appears, the first normally conducting amplifier changes the voltage at the common point, the signal developed being of sufficient magnitude to turn on the third or inverter amplifier. Simultaneously, the inverter provides a feedback signal to substantially turn off the second normally conducting transistor. Such operation provides the second normally conducting transistor with a negative resistance characteristic which provides defined discrimination between input signal levels. The circuit can be adapted to have high signal gains through matching the emitter-base characteristics of the first normally conducting transistor to the negative resistance characteristic of the second normally conducting transistor. Additionally, connecting in a suitable manner an additional amplifier to the described circuit will provide Exclusive-OR operation and AND operation depending upon the choice of outputs from the circuit.

Operating the fourth amplifier inhibits the circuit with respect to any input signal.

A feature of the invention is a negative resistance amplifier providing high gain and being adaptable for a variety of logic operations.

Another feature is a cascade amplifier arranged for nonsaturating operation and low power consumption, the amplifier cooperating with a feedback network to provide NOR outputs with defined input signal level discrimination.

Another feature is a direct coupled amplifier developing a feedback signal that provides the amplifier with a negative resistance characteristic which may be employed as a reference in discriminating between input signal levels.

Another feature is a pair of transistors connected in series aiding relation wherein both transistors are normally conducting, one normally conducting amplifier being controlled by an inverter amplifier, the pair of transistors being responsive to an input signal to develop two output signals, one of which appears at the collector of the first normally conducting transistors and the other of which appears as an input to the inverter which provides an output the inverse of the input signal.

The foregoing and other objects, features and advantages of the invention will be apparent from the following more particular description of the preferred embodiments of the invention, as illustrated in the accompanying drawing.

FIGURE 6 is an electrical schematic of an Exclusive-OR circuit.

FIGURE 7 is a current-voltage characteristic of the circuit of FIGURE 6 taken at the same point as that for FIGURE 2.

FIGURES 8A and 8B are switching maps for the circuit of FIGURE 6.

Figure 1:
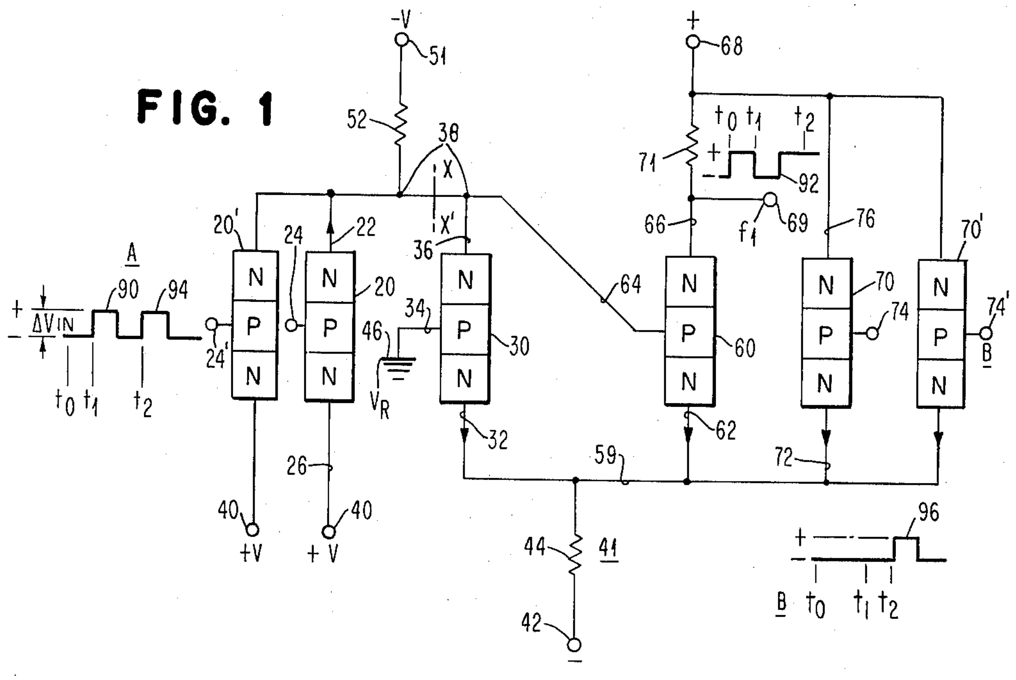
FIGURE 1 is an electrical schematic of one embodiment of the present invention having at least two serially connected amplifiers with a common junction therebetween.

Referring to FIGURE 1, a first transistor amplifier 20 having an emitter 22, base 24 and collector 26 is connected in series aiding relation with a second transistor amplifier 30 having an emitter 32, base 34 and collector 36, the emitter 22 of the latter being connected to the collector 36 of the former. The transistors 20 and 30 are of like conductivity and a common junction 38 interconnects the emitter 22 and the collector 36, respectively. The transistor 20 is adapted to receive input signals of suitable polarity at the base electrode 24. The normal signal level is selected to bias the transistor 20 into a slightly conducting condition. The collector 26 is connected to a voltage supply 40.

A current sink 41 including a voltage source 42 of suitable polarity and a resistor 44 is connected to the emitter electrode 32 of the transistor 30. The base electrode 34 thereof is connected to $V_R$ a reference potential 46, typically ground, which biases the transistor into a conducting condition. The collector 36 is joined to the emitter electrode 22 of the transistor 20 and the common junction 38 is connected through a resistor 52 to a voltage supply 51 of suitable polarity. Additionally, the collector 36 is directly connected to a third or inverter amplifier 60 including an emitter 62, base 64 and collector 66, the base 64 receiving the input from the collector 36 of the amplifier 30. The voltage normally appearing at the collector 36 maintains the inverter amplifier 60 in a nonconducting state, the voltage being the level of the input circuit less the emitter-base diode drop of the transistor 20. The emitter 62 of the amplifier 60 is connected to the current sink 41 and the common connection between the emitters 32 and 62 complete a feedback path 59 including lead 64, transistor 60 and the common connector between the amplifiers 60 and 30. The collector electrode 66 is connected to a voltage supply 68 by way of a suitable load resistor 71. An output circuit 69 is connected between the collector 66 and the load resistor 71.

Connected in parallel with the amplifier 60 is a fourth or inhibit amplifier 70 including an emitter 72, base 74 and collector 76. The emitter 72 is connected to the current sink 41 and the collector 76 is directly connected to the voltage supply 68. The base electrode 74 is adapted to receive an input signal. The amplifier 70 is biased into a cut-off condition by the signal level normally appearing at the base electrode 74.

The circuit of FIGURE 1 is adapted to perform the logic statement:

$$f_1=(\bar{A}_1+\bar{A}_2+\bar{A}_3+ \; . \; . \; . \; A_n)+(B_1+B_2+B_3+ \; . \; . \; . \; B_n) \quad (1)$$

where:

$f_1$=an inhibited NOR or implication function $A_1$ . . . $A_n$=independent signals appearing at the amplifier 20 or like amplifiers in parallel therewith and $B_1$ . . . $B_n$=independent signals appearing at the amplifier 70 or like amplifiers in parallel therewith.

Signals corresponding to the independent $A_1$, $A_2$, $A_3$ . . . $A_n$ and $B_1$, $B_2$, $B_3$ . . . $B_n$ inputs are indicated at the respective base electrodes 24, 24′, 24″ . . . $24^{n\prime}$ and 74, 74′, 74″ . . . $74^{n\prime}$, respectively. The dependent signal $(\bar{A}_1+\bar{A}_2 \; . \; . \; . \; \bar{A}_n)$, corresponding to a NOR function, appears at the output circuit 69 and may be inhibited by the $B_1$ . . . $B_n$ signal. The logic statement appearing as Equation 1 may be conveniently modified according to whether positive logic or negative logic is employed. Also, the statement may be modified by De Morgan's theory described in any well-known symbolic logic text. It should also be noted that the circuit is not limited to the logic statement of Equation 1 but other statements may be developed at the different electrodes of the amplifiers if desired. For reasons of brevity, however, the operation of the circuit will be described for Equation 1 at three different input conditions which have been selected to occur at times $t_0$, $t_1$ and $t_2$. Before describing the operation of the circuit, it is believed in order to describe the operating characteristic of the transistor 30 which controls the output signal.

Figure 2:
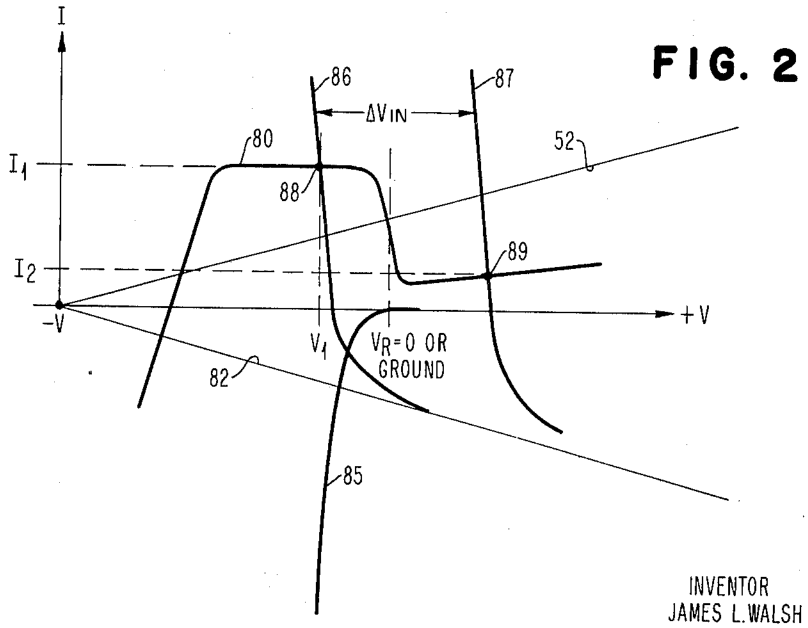
FIGURE 2 is a voltage-current characteristic of the circuit of FIGURE 1 taken at the common junction.

Operation of the amplifier is best understood by considering the collector 36 at point X–$X_1$ on the junction 38. The emitter-base diode of the amplifier 20 and the resistor 52 appear as a load to the amplifier 30. The current-voltage characteristic for the junction 38 is described in FIGURE 2. The curve 80 describes the collector-current and voltage characteristic of the amplifier 30. The characteristic curve for the resistor 52 is designated by reference character 82. The emitter-base diode characteristic of the amplifier 20 is described by a curve 85. The diode is adapted to conduct when an input signal exceeds the reference voltage $V_R$ or the reference voltage is lowered below its assigned voltage. The curves 82 and 85 appear in different quadrants of the indicated rectangular coordinate system, the latter appearing in the first quadrant and the former appearing in the fourth quadrant. The combined effect of the emitter-base diode and resistor is represented in FIGURE 2 by composite curve 86. The procedure for combining graphically the curves 82 and 85 is described in any well-known text on nonlinear circuit analysis, for example, "Introduction to Nonlinear Analysis" by W. J. Cunningham, McGraw-Hill Company, 1958, Chapter 3. At the intersection between the curves 80 and 86, an operating point 88 is established, the operating point being the simultaneous solution for the curves 80 and 86. The voltage $V_1$ and the current $I_1$ indicated for the operating point 88, are applied to the amplifier 60 as an input. The voltage $V_1$ maintains the amplifier 60 in a nonconducting condition. With the amplifier 60 in a cut-off condition, the output voltage approximates that of the supply 68.

An input signal to the amplifier 20 increases the voltage at the common junction 38 or collector 36 so that the amplifier 60 is driven into a conducting condition. Stated another way, the input signal displaces the operating curve 86 to a new position 87, the displacement being related to the magnitude of the input signal. Turn-on of the amplifier 60 increases the potential of the emitter electrode 62 which rises toward that appearing across the base-emitter junction of the amplifier 60. Since the emitter electrode 62 is directly connected to the emitter electrode 32, the increased voltage is supplied as an input signal to the amplifier 30. The input signal increases the potential of the emitter electrode 32 with respect to the fixed voltage applied to the base electrode 34 so that conduction through the amplifiers 20 and 30 is reduced to a lower level $I_2$ indicated in FIGURE 2. It will be appreciated that the sharp drop in collector current for the amplifier 30 establishes a negative resistance characteristic for that device. The intersection of the operating curve 87 with the operating characteristic 80 at the reduced current level $I_2$ establishes a stable operating point 89 which is maintained as long as amplifier 20 is receiving the input signal. On removal of the input signal, circuit operation is restored to the operating point 88.

Operation of the circuit will now be considered in more detail. The input/output signals to/from the circuit are indicated adjacent to the base electrodes 24, 74 and output circuit 69, respectively. At time $t_0$ both amplifiers 20 and 30 are conducting due to their respective base voltages. The amplifiers 60 and 70 are nonconducting due to the voltage at the common junction 38 and the signal level applied to the base electrode 74, respectively. The collector voltage of the amplifier 60 approaches that of the supply 68. At the time $t_1$ an input signal 90 applied to the amplifier 20 increases the voltage at the common junction 38 and turns on the amplifier 60. A feedback signal, as previously described, is transmitted over the path 59 to establish operation of the amplifier 30 at the operating point 89. Simultaneously, the collector voltage of amplifier 60 falls toward supply voltage 42 and an output pulse 92 appears as the inverse of the input pulse 90. On release of the pulse 90, the circuit returns to the condition described for the time $t_0$.

At time $t_2$, an input pulse 94 to the amplifier 20 and an input pulse 96 to the amplifier 70 retains the output level at that indicated for the time $t_0$. The pulse 94 changes the collector-current collector voltage for the junction 38 for reasons previously indicated. When the amplifier 70 turns on, however, the current for the sink 41 is furnished by the amplifier 70 so that although the voltage at the junction 38 does change to the value at time $t_1$, little additional current flows through the amplifier 60. The voltage at the terminal 69, as a consequence, remains the same as that at time $t_0$. Thus, the amplifier 70 inhibits the operation of the circuit when an input signal appears at the amplifier 20.

The circuit is nonsaturating in operation because a well-defined current is switched and suitable values of voltages 51 and 68 and resistors 52 and 71 are selected. The circuit will operate in a non-saturated condition in the event the input signal is increased beyond the magnitude of the supply 40. The nonsaturating feature enables the circuit to have fast response to turn-on and turn-off signals. Additionally, matching the slope of the operating characteristic 86 and the negative resistance characteristic of the amplifier 30 enables high signal gains to be obtained since a minimum change in the input will produce a large variation in output. Further, the defined negative resistance characteristic provides sharp discrimination between turn-on and turn-off signals for the circuit. Thus, the present embodiment has high speed without saturation, sharp discrimination and logic potential, the latter of which will appear in more detail hereafter.

Figure 3:
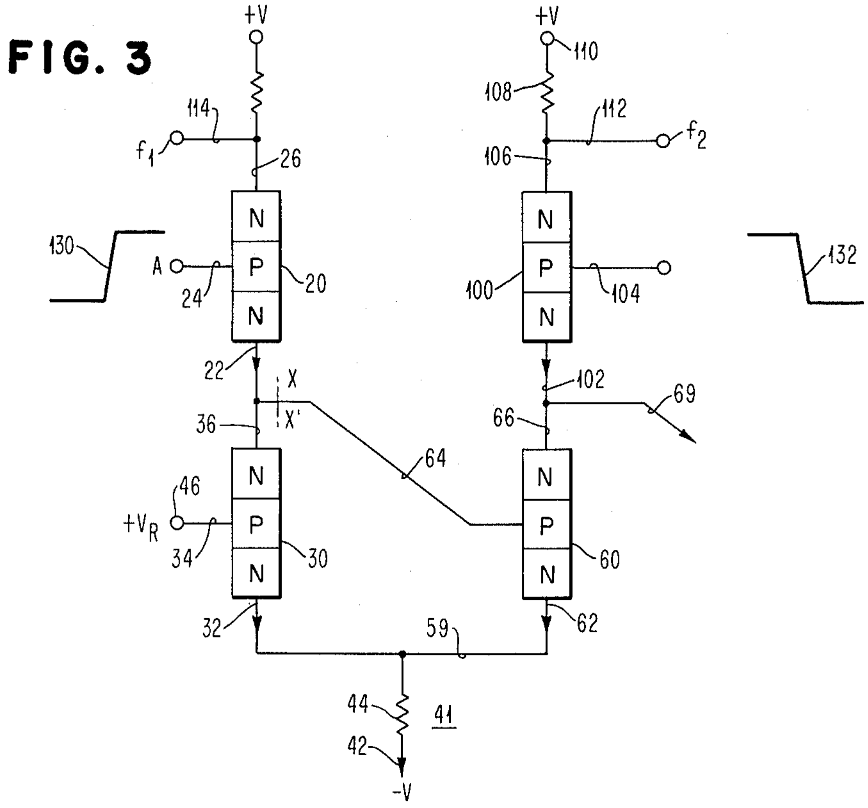
FIGURE 3 is an electrical schematic of an AND-OR circuit employing the features of the circuit disclosed in FIGURE 1.

Referring to FIGURE 3, another embodiment employs a circuit arrangement similar to that described in FIGURE 1. Accordingly, circuit elements in FIGURE 3, corresponding to those shown in FIGURE 1, will have the same reference characters. It will be noted that the resistor 52 and the voltage supply 51 have been omitted from the circuit of FIGURE 3. These elements only serve to alter the characteristic of the emitter-base diode of the amplifier 20. Also, the amplifier 70 has been deleted, but may be employed if an inhibit operation is desired. Cooperating with the amplifier 60, however, is amplifier 100 having an emitter electrode 102, base electrode 104 and collector electrode 106. The emitter electrode 102 is connected to the collector electrode 66 of the amplifier 60. The output circuit 69 is connected to the common junction therebetween. The collector electrode 106 is connected through a suitable load impedance 108 to a voltage supply 110. A second output circuit 112 is connected to the collector electrode 106. A third output circuit 114 is connected to the collector electrode 26 of the amplifier 20. Operation of the circuit shown in FIGURE 3 will be given after a description of the operating characteristic of the common junction 38.

Figure 4:
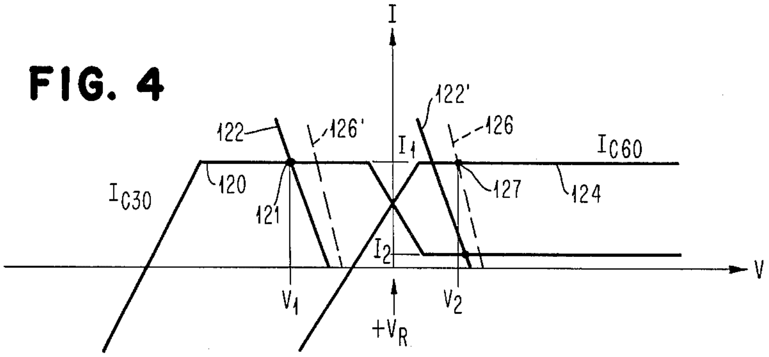
FIGURE 4 is a voltage-current graph for FIGURE 3 taken at the same point as for FIGURE 2.

As in FIGURE 1, the amplifier 30 is normally conducting in a nonsaturated condition and the amplifier 20 is also normally conducting. The collector current-voltage relation for the amplifier 30 is given in FIGURE 4 as curve 120. The reference point for the curve is the reference voltage connected to the base electrode of the amplifier 30. Accordingly, the rectangular coordinate system axes originate at this point, for reasons of convenience only. The emitter-base diode of the amplifier 20 establishes a load line 122 on the curve 120 for reasons previously indicated. The intersection between the curves 120 and 122 establishes a stable operating point 121 for the amplifier 30 at a current $I_1$ and voltage $V_1$. The amplifier 60 is directly coupled to the amplifier 30 and is also biased non-conducting by the voltage of the operating point 121 which appears at the common point 38. The operating characteristic of the amplifier 60 is indicated as curve 124. Since the amplifier 60 turns on when the amplifier 30 turns off, the characteristic curve 124 is the reverse image of the curve 120 about the reference voltage. The amplifier 100 serves as the load for the amplifier 60. The amplifier 100 is biased nonconducting by the signal level applied to the base electrode 104. The emitter-base diode curve 126 of the amplifier 100 is indicated on the curve 124, the intersection between the curves 124 and 126 establishing a stable operating point 127 for the amplifier 60 at the current $I_1$ and voltage $V_2$. Thus, in the normal condition the amplifiers 20 and 30 are conducting whereas the amplifiers 60 and 100 are nonconducting. It should be noted that the amplifier 30 has a negative resistance characteristic due to the feedback path 59. A more detailed description of the circuit of FIGURE 3 will now follow.

An input signal 130 which operates to turn on the amplifier 20 shifts the load line 122 to a new position 122′ which turns on the amplifier 60. The feedback signal developed by the amplifier 60 increases the emitter potential of the amplifier 30 so that current flow through the latter is reduced to a level $I_2$ indicated in FIGURE 4. The collector voltage of the amplifier 20 rises toward that appearing at the voltage supply +V. When the amplifier 60 turns on, however, the amplifier 100, which is cut off, appears as an infinite load so that little or no current flows therethrough and the collector potential remains near that of the supply connected thereto.

An input signal 132 to the base electrode 104 operates to turn on the amplifier 100 thereby shifting the load line to a position 126′. The new load line increases conduction through the amplifier 100, but little or no current flows since the amplifier 60 is held nonconducting by the junction 38. The collector voltage at the amplifier 100, as a consequence, does not change. The amplifier 20, however, conducts through the amplifier 30 and the potential at the collector 36 approaches that of input signal level.

When input signals 130 and 132 are applied to the base electrodes 34 and 104, respectively, both amplifiers 20 and 100, respectively, are turned on. The amplifier 60 turns on when the amplifier 20 turns on. Thereafter, the amplifier 30 turns off due to the feedback signal. The collector potential of the amplifier 100, therefore, falls to a level approaching the emitter base potential of the amplifier 60. With the amplifier 30 turned off, current flow through the amplifier 20 is not increased so the collector potential continues to remain near that of the supply connected thereto.

Figure 5A:
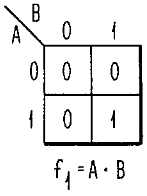
FIGURES 5A and 5B are switching maps for the circuit of FIGURE 3.
Figure 5B:
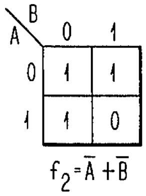

Summarizing, the signal functions of the output circuits 112 and 114 are as indicated in FIGURES 5B and 5A, respectively, which are Karnaugh Maps for the various input signals appearing at the respective electrodes. A "1" designation in the map is a higher order potential and a "0" designation in the map is a lower order potential. Karnaugh Maps are described in the text "Switching Circuits and Logical Design" by S. Caldwell, John Wiley & Sons, New York, New York, Second Printing, pages 131 through 143. As indicated in the text, the logic functions describing the maps are the conventional AND function and the conventional not AND function.

Another embodiment of the present invention, shown in FIGURE 6, is adapted to perform the well-known Exclusive-OR function. The embodiment is similar to that shown in FIGURE 1 so that like elements to those shown in FIGURE 1 will have the same reference character designation in FIGURE 6. The principal difference between the embodiment shown in FIGURE 1 and that shown in FIGURE 6 is the omission of the reference voltage 46 connected to the base of the amplifier 30. Instead one electrode of an amplifier 150 is connected thereto. Included in the amplifier 150 are emitter electrode 152, base electrode 154 and collector electrode 156. The emitter electrode 152 is directly connected to the base electrode 34 of the amplifier 30. The collector electrode 156 is directly connected to a source of voltage 158 of suitable polarity. An input signal is supplied to the base electrode 154. The input signal level is sufficient to maintain the amplifier 150 slightly conducting. The base voltage of the amplifier 150 is the reference voltage for the amplifier 30. Outputs for the circuit are taken at the collector electrodes 36 and 66 of the amplifiers 30 and 60, respectively. Normally, the amplifier 30 is forward biased and conducting due to the reference voltage at the base electrode 34 whereas the remaining amplifiers of the circuit are nonconducting. Operation of the circuit will be described after consideration of the current-voltage characteristic, therefore, taken at the common point between the amplifiers 20 and 30.

The collector current-voltage characteristic for the amplifier is indicated as curve 160 in FIGURE 7. The emitter-base diode of the amplifier 30 appears as a load to the amplifier 20. The emitter-base diode characteristic is described by a curve 162 and for reasons previously indicated, intersects the curve 160 to establish an operating point 164 at a current $I_1$ and voltage $V_1$. The reference voltage for the curve 162 is that appearing at the base electrode 34 of the amplifier 30. It will be apparent that a change in the signal level applied to the base electrode 154 will shift the position of the curve 160 along the voltage axis in proportion to the change in the reference voltage.

For purposes of description, reference characters A and B will be assigned to the input signals applied to the amplifiers 20 and 150, respectively. Since the reference voltage for the curve 160 is the B signal, the curve can be designated the $\overline{B}$ or absence of the B signal condition of the amplifier 30. Similarly, the curve 162 can be designated the $\overline{A}$ or absence of the A signal condition of the amplifier. The operating point 164, therefore, corresponds to a circuit operating state $\overline{AB}$.

An A input to the amplifier 20 shifts the load line 162 to a new position 162'. The load line intersects the curve 160 at a new point 166 which is in the low conducting state of the amplifier 30. The operating point 166 corresponds to a circuit operating state A and $\overline{B}$ since the A signal is present but the B signal is absent. The amplifier 30, as a result, operates at a reduced current $I_2$ and increased voltage $V_2$ due to the negative feedback of the amplifier 60.

In the event a B signal is applied to the amplifier 150 but an A signal is not applied to the amplifier 20, the characteristic curve 160 will be shifted to a new position 160', due to a change in the reference voltage applied to the base electrode of the amplifier 30. The curve 160' can be referred to as the B curve since the B signal is present at the circuit. The emitter-base curve 162 now intersects the curve 160' at a new intersection 168. The intersection corresponds to a circuit operating state $\overline{A}$ and B since the A input is absent and the B input is present.

An A input to the amplifier 20 at the same time a B input is applied to the amplifier 150 shifts the curves 160 and 162 to the positions 160' and 162' which establishes a new intersection 170. The intersection 170 corresponds to a circuit operating state A and B since both signals are present at the circuit.

Thus, the circuit has four different operating points according to the inputs applied thereto. For like inputs, a current of preselected magnitude is generated by the circuit. For unlike inputs, little or no current is generated by the circuit. A more particular description of the circuit operation will now be given in conjunction with FIGURES 6 and 7.

With the A and B inputs down, the amplifiers 20, 30 and 150 are conducting whereas the amplifier 60 is nonconducting. The collector voltage of the amplifier 20 falls toward that of the reference voltage connected to the base electrode of the amplifier 150. The collector voltage of the amplifier 60, however, approaches that of the supply 68 since the amplifier is nonconducting. An A input to the amplifier 20 establishes circuit operation at the intersection 166. The increased voltage at the common point 38 turns on the amplifier 60 which turns off the amplifier 30. The collector potential of the amplifier 20 increases toward that of the supply 40 (see FIGURE 1), whereas the collector potential of the amplifier 60 falls toward that of the supply 42.

Release of the A signal and application of a B signal to the amplifier 150 establishes circuit operation at the intersection 168. The collector voltage of the amplifier 30 increases which further turns off the amplifier 20. The collector voltage thereof remains near that of the supply connected thereto. Simultaneously, the amplifier 60 turns on due to the increased collector potential of the amplifier 30. The collector potential of the amplifier 60 falls toward that of the supply 41.

An A and B signal to the amplifiers 20 and 150, respectively, establishes circuit operation at the intersection 170. The collector potential of the amplifier 30 remains substantially near ground since the amplifier 20 turns on due to the A signal. Accordingly, the collector potential of the amplifier 20 falls toward the reference voltage connected to the base of the amplifier 150 whereas the collector potential of the amplifier 60 continues to remain near that the voltage supply 68.

In summary, the operation of the circuit is given in the Karnaugh Maps shown in FIGURES 8A and 8B. It is apparent that the map shown in FIGURE 8A describes the true Exclusive-OR function apearing at the collector electrode 26 whereas the map shown in FIGURE 8B describes the complement of the Exclusive-OR function. The circuit of FIGURE 6 has a minimum number of active elements for these functions. This feature is especially desirable in computers and the like apparatus where prodigal number of such circuits are required. Additionally, the inhibit transistor 70 may be employed to prevent any output from the circuit when one or more input signals are received. Such an arrangement provides the circuit with the capacity to duplicate any logical statements employed in computers and the like apparatus. The nonsaturating qualities and logic flexibility renders the present invention particularly desirable to logic circuit technology. Also, the direct coupling eliminates power drain normally due to impedance elements. Thus, the present invention has low power consumption which makes it particularly attractive for manufacture in integrated circuit form.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A switching circuit comprising
at least one first transistor having first base, first emitter and first collector electrodes,
a second transistor having second base, second emitter and second collector electrodes,
a third transistor having third base, third emitter and third collector electrodes,
a current supply,
the first emitter, second collector and third base electrodes connected to a common junction,
the second emitter and third emitter connected to the current supply,
the second base electrode connected to a source of reference potential,
the first collector electrodes connected to a supply voltage,
signal input means connected to the first base electrodes, and
load circuit means including an output circuit connected to the third collector electrode.

2. A switching circuit described in claim 1 including at least one fourth transistor having fourth base, fourth emitter and fourth collector electrodes,
the fourth emitter electrodes connected to the current source,
the fourth colector electrodes connected to the load circuit means, and
second input circuit means connected to the fourth base electrodes.

3. A switching circuit described in claim 2 wherein an input signal of a first polarity supplied to any first input circuit will appear at the output circuit as a signal of opposite polarity unless an input signal of the first polarity is supplied to any second input circuit means.

4. A direct coupled amplifier comprising:
first and second transistors, each of said transistors having at least emitter, collector and base electrodes,
means for interconnecting said transistors to provide a series current path through said emitter and collector electrodes, thereof,
a third transistor having third emitter, third base and third collector electrode, said third base and third emitter electrode directly connected to the collector and emitter electrodes, respectively, of said second transistor, output circuit means connected to the third collector electrode, and means biasing the first and second transistors the collector of the second transistor being normally slightly forward biased relative to the base electrode of the second transistor whereby the first and second transistors are normally conducting and the third transistor is nonconducting and when the first and second transistors are substantially nonconducting the third transistor is conducting.

5. A direct coupled amplifier comprising:

first and second transistors, each of said transistors having at least emitter, collector and base electrodes, means for interconnecting said transistors to provide a series current path through said emitter and collector electrodes, thereof, means biasing the first and second transistors whereby the collector electrode of the second transistor is normally forward biased with respect to the base electrode of the second transistor, a third transistor having third base, third emitter and third collector electrodes, said third base and emitter electrodes being directly coupled to said collector and emitter electrodes of said second transistor, respectively, output circuit means coupled to the third collector electrode, and input means connected to said series current path whereby the first and second transistors are normally conducting in a non-saturated condition and when a preselected signal is received the first and second transistors are rendered substantially nonconducting and the third transistor is rendered conducting.

6. A direct coupled amplier comprising:

a first and second transistors, each of said transistors having at least emitter, collector and base electrodes, means for interconnecting said transistors to provide a series current path through said emitter and collector electrodes, thereof, a third transistor having third emitter, third base and third collector electrodes, said third base and emitter electrodes directly connected to the collector and emitter electrodes of the second transistor, respectively, output circuit means including a voltage supply coupled to said third collector electrodes, at least one fourth transistor having fourth emitter, fourth base and fourth collector electrodes, the fourth emitter and fourth collector electrodes being connected to said third emitter and the voltage supply, respectively as an inhibit means, and means biasing the collector and base and emitter of the first and second transistors, respectively, whereby the first and second transistors are normally conducting and the third transistor is non-conducting, the collector electrode of the second transistor being forward biased with respect to the base electrode of the second transistor, and when the first and second transistors are rendered substantially nonconducting, the third transistor is conducting, the fourth transistor being adapted to inhibit current flow through the third transistor.

7. A logic circuit comprising:

first and second transistors, each of said transistors having at least emitter, collector and base electrodes, means for interconnecting said transistors to provide a series current path through said emitter and collector electrodes, thereof, at least one transistor having emiter, base and collector electrodes, the emitter and collector electrodes, thereof connected to corresponding electrodes of the first transistor, all transistors so connected receiving a separate input at their respective base electrodes, an inverter having base, emitter and collector electrodes, the base and emitter electrodes of the inverter being connected to different electrodes of the second transistor, an output circuit connected to the inverter connector electrode, and means biasing the first transistor, those transistors connected to the first transistor, and the second transistor to be normally conducting and the inverter nonconducting whereby a preselected input signal polarity at the respective base electrodes turns on the inverter which renders the first and second transistors substantially non-conducting, the inverter providing an output signal which is the inverse of the preselected input signal.

8. A logic circuit comprising:

first and second transistors, each of said transistors having at least emitter, base and collector electrodes, means for interconnecting said transistors to provide a series current path through said emitter and collector electrodes, thereof, at least one transistor having emitter, base and collector electrodes, the collector and emitter electrodes, thereof connected to corresponding electrodes of the first transistor, separate and independent input circuits connected to the base electrodes of the transistors having their emitter and collector electrodes connected together, a feedback path including a transistor having base, emitter and collector electrodes, the base and emitter electrodes, thereof, connected to the collector and emitter electrodes of the second transistor, an output circuit connected to the collector of the transistor in the feedback path, and means biasing the series circuit and the feedback path whereby the series circuit is normally conducting and the feedback path is nonconducting.

9. The logic circuit defined in claim 8 including means to inhibit current in the feedback path.

10. A switching circuit comprising:

first and second transistors, each having base, emitter and collector electrodes, means interconnecting said first and second transistors to provide a series current path through the emitter and collector electrodes of the first and second transistors, said series current path being directly connected between a voltage supply and a current source, an input circuit connected to the base electrode of the first transistor, means biasing the base electrode of the second transistor to render the collector electrode of the second transistor slightly forward biased relative to the base electrode, means including a third transistor having emitter, base and collector electrodes, the base and emitter electrodes of the third transistor connected to the series current path to provide the second transistor with a negative resistance characteristic when a preselected input signal is provided to the input circuit, and an output circuit connected to the collector of the third transistor.

References Cited by the Examiner

UNITED STATES PATENTS

| | | | |
|---|---|---|---|
| 2,903,604 | 9/1959 | Henle. | |
| 2,919,355 | 12/1959 | Haung. | |
| 2,943,282 | 6/1960 | Pfiffner | 307—80 |
| 2,951,951 | 9/1960 | Morgan. | |
| 2,973,437 | 2/1961 | Bradley et al. | |
| 2,986,650 | 5/1961 | Wolfendale. | |

(Other references on following page)

UNITED STATES PATENTS

| | | |
|---|---|---|
| 2,986,651 | 5/1961 | Schayes et al. |
| 3,007,060 | 10/1961 | Guenther. |
| 3,061,671 | 10/1962 | Waller. |

OTHER REFERENCES

Cinema Television Ltd., 782,749, Sept. 11, 1957.

Hunter: Handbook of Semiconductor Electronics, McGraw Hill, 1st ed. 1956, pp. 18–1 to 18–7 relied on.

Hurley: Junction Transistor Electronics, Wiley & Sons, 1958, pp. 140–141 relied on.

Millman et al.: Pulse and Digital Circuits, McGraw-Hill, 1960, pp. 147 to 149 relied on.

Schwartz: Selected Semiconductor Circuits Handbook, Wiley & Sons, 1960, pp. 6–55 and 6–56 relied on.

Strauss: Wave Generation and Shaping, McGraw-Hill, 1960, pp. 349, 350 relied on.

Walsh: I.B.M. Technical Disclosure Bulletin, vol. 5, No. 8, January 1963, page 40.

Linvill: Transistors and Active Circuits, McGraw-Hill, 1961, (pages 350 to 354 relied on).

ARTHUR GAUSS, *Primary Examiner.*